United States Patent
Narayanan

(10) Patent No.: US 11,821,938 B2
(45) Date of Patent: Nov. 21, 2023

(54) RIGID-FLEX PRINTED CIRCUIT BOARD INCLUDING BUILT-IN DIAGNOSTIC

(71) Applicant: Hamilton Sundstrand Corporation, Charlotte, NC (US)

(72) Inventor: Gomathi Ganesh Narayanan, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 5 days.

(21) Appl. No.: 17/540,416

(22) Filed: Dec. 2, 2021

(65) Prior Publication Data
US 2023/0101751 A1 Mar. 30, 2023

(30) Foreign Application Priority Data
Sep. 30, 2021 (IN) .............................. 202111044400

(51) Int. Cl.
*G01R 31/28* (2006.01)
*G08B 7/06* (2006.01)
*G08B 21/18* (2006.01)
*H05K 1/14* (2006.01)

(52) U.S. Cl.
CPC .......... *G01R 31/2801* (2013.01); *G08B 7/06* (2013.01); *G08B 21/185* (2013.01); *H05K 1/147* (2013.01)

(58) Field of Classification Search
CPC .................................................. G01R 31/2801
See application file for complete search history.

(56) References Cited

U.S. PATENT DOCUMENTS

| | | | |
|---|---|---|---|
| 4,328,264 A | 5/1982 | Johns et al. | |
| 5,144,742 A * | 9/1992 | Lucas | H05K 3/4691 29/830 |
| 5,461,324 A | 10/1995 | Boyette et al. | |
| 5,467,020 A | 11/1995 | Boyette, Jr. et al. | |
| 7,126,879 B2 | 10/2006 | Snyder | |
| 9,226,410 B2 | 12/2015 | Johnston | |
| 10,157,527 B1 | 12/2018 | Bartley et al. | |
| 2002/0101256 A1 * | 8/2002 | Brown | G01R 31/2818 324/763.01 |
| 2004/0040148 A1 | 3/2004 | Demaso et al. | |
| 2015/0163937 A1 * | 6/2015 | McClatchie | H05K 1/147 361/728 |
| 2017/0118838 A1 | 4/2017 | Williams et al. | |
| 2018/0089984 A1 | 3/2018 | Subramanian et al. | |
| 2018/0301890 A1 | 10/2018 | Bemat et al. | |
| 2018/0352120 A1 * | 12/2018 | Zurowski | H05K 5/069 |
| 2021/0004500 A1 | 1/2021 | Lewis | |

OTHER PUBLICATIONS

Search Report issued in European Patent Application No. 22195830.9; Application Filing Date Sep. 15, 2022; dated Feb. 27, 2023 (7 pages).

* cited by examiner

*Primary Examiner* — Travis R Hunnings
(74) *Attorney, Agent, or Firm* — CANTOR COLBURN LLP

(57) ABSTRACT

A rigid-flex printed circuit board (PCB) includes at least one rigid PCB including at least one electrical component, a flex circuit, and a built-in diagnostic circuit. The flex circuit includes at least one end connected to the at least one rigid PCD. The flex circuit includes at least one signal trace configured to deliver an electrical signal to the at least one electrical component. The built-in diagnostic circuit is configured to detect a fault in the rigid-flex PCB.

18 Claims, 7 Drawing Sheets

RIGID-FLEX PRINTED CIRCUIT BOARD INCLUDING BUILT-IN DIAGNOSTIC

CROSS-REFERENCE TO RELATED APPLICATIONS

This application claims the benefit of Indian Application No. 202111044400 filed Sep. 30, 2021, which is incorporated herein by reference in its entirety.

BACKGROUND

Exemplary embodiments generally pertain to electronic circuits, and in particular, rigid-flex printed circuit boards.

Printed circuit boards (PCBs) connect electrical components together using discrete wiring, resulting in a complete and functional unit. The three main types of PCBs typically used in electronic application are rigid PCBs, flexible PCBs (sometimes referred to as flex circuits), and rigid-flex PCBs. Rigid PCBs are formed entirely from a rigid material and are therefore inflexible. Rigid circuit boards are popular largely due to their low cost. In conventional electronics, and particularly in consumer electronics, with greater space availability, manufacturers can save significantly by using rigid circuit boards. Flex PCBs, however, are formed entirely from a flexible material, and therefore can be bent or otherwise shaped. Flex PCBs provide several advantages over rigid PCBs such as, for example, physical flexibility allowing for reduced area and space consumption, connectivity, reduced weight, durability, and resilience to environmental conditions.

Rigid-flex PCBs are a hybrid of both rigid and flex PCBs. A rigid-flex PCB incorporates flexible materials in conjunction with rigid materials by layering flexible circuit substrates inside of the rigid circuit board materials, ultimately combining the versatility of flexible circuits with the stability, strength and circuit routing densities of rigid PCBs.

BRIEF DESCRIPTION

According to a non-limiting embodiment, a rigid-flex printed circuit board (PCB) is provided. The rigid-flex PCB includes at least one rigid PCB including at least one electrical component, a flex circuit, and a built-in diagnostic circuit. The flex circuit includes at least one end connected to the at least one rigid PCD. The flex circuit includes at least one signal trace configured to deliver an electrical signal to the at least one electrical component. The built-in diagnostic circuit is configured to detect a fault in the rigid-flex PCB.

In addition to one or more of the features described above, or as an alternative to any of the foregoing embodiments, the built-in diagnostic circuit comprises a diagnostic device installed on the at least one rigid PCB, and a diagnostic trace formed on the flex circuit, wherein the diagnostic device detects the circuit fault in response to an open circuit occurring in the diagnostic trace.

In addition to one or more of the features described above, or as an alternative to any of the foregoing embodiments, the diagnostic device generates an alert in response to detecting the fault, the fault including one or more of a light alert, a sound alert, a haptic alert, and an interrupt to system software to initiate a safe shutdown or a fail-safe procedure.

In addition to one or more of the features described above, or as an alternative to any of the foregoing embodiments, the at least one rigid PCB includes a first rigid PCB including a first electrical component, and the first rigid PCB includes a first edge coupled to a first end of the flex circuit to establish a first joint region.

In addition to one or more of the features described above, or as an alternative to any of the foregoing embodiments, a second rigid PCB includes a second electrical component. The second rigid PCB includes a second edge coupled to a second end of the flex circuit opposite the first end to establish a second joint region.

In addition to one or more of the features described above, or as an alternative to any of the foregoing embodiments, the first and second rigid PCBs are formed from a rigid material such as, for example, a flat laminated composite board of non-conducting substrate material (e.g., fiberglass), the board including one or more layers of metal.

In addition to one or more of the features described above, or as an alternative to any of the foregoing embodiments, the diagnostic trace has a serpentine profile that meanders from a first edge trace portion formed on the first rigid PCB and extending through the first joint region to a second edge trace portion formed on the second rigid PCB and extending through the second joint region.

In addition to one or more of the features described above, or as an alternative to any of the foregoing embodiments, the diagnostic device is installed on the first rigid PCB, a signal source is installed on the second rigid PCB, and the diagnostic trace establishes signal communication between the diagnostic device and the signal source.

In addition to one or more of the features described above, or as an alternative to any of the foregoing embodiments, the first edge trace includes a first proximate end that is connected to the diagnostic trace formed on the flex circuit and a first distal end that is connected to the diagnostic device. The second edge trace includes a second proximate end that is connected to the signal source and a second distal end that is connected to the diagnostic trace formed on the flex circuit.

In addition to one or more of the features described above, or as an alternative to any of the foregoing embodiments, the diagnostic device is a light emitting diode (LED) configured to emit light in response to a closed circuit between the signal source and the diagnostic device, and configured to stop emitting light in response to an open circuit between the signal source and the diagnostic device.

In addition to one or more of the features described above, or as an alternative to any of the foregoing embodiments, the diagnostic device is a processor configured to execute at least one of a trace conductivity test and a Power on Built in Test (PBIT) in response to powering on the processor, the processor configured to generate the alert in response to an open circuit between the signal source and the diagnostic device.

In addition to one or more of the features described above, or as an alternative to any of the foregoing embodiments, the at least one signal trace has a first size (e.g., width) and the diagnostic trace has a second size (e.g., width) that is less than the first width.

In addition to one or more of the features described above, or as an alternative to any of the foregoing embodiments, the at least one signal trace is located between a first portion of the diagnostic trace formed on the flex circuit and a second portion of the diagnostic trace formed on the flex circuit.

In addition to one or more of the features described above, or as an alternative to any of the foregoing embodiments, the built-in diagnostic circuit comprises a first edge trace that includes a first proximate end that is connected to the diagnostic trace formed on the flex circuit and a first distal end that is connected to a first test pad, and a second edge trace that includes a second proximate end that is connected to a second test pad and a second distal end that is connected to the diagnostic trace formed on the flex circuit.

In addition to one or more of the features described above, or as an alternative to any of the foregoing embodiments, the first test pad is configured to be connected to a first input of a diagnostic device and the second test pad is configured to be connected to a second input of the diagnostic device.

In addition to one or more of the features described above, or as an alternative to any of the foregoing embodiments, the diagnostic device is configured to measure one or more of resistance between the first test pad and the second test pad, current between the first test pad and the second test pad, and voltage between the first test pad and the second test pad.

In addition to one or more of the features described above, or as an alternative to any of the foregoing embodiments, the flex circuit includes a first end coupled to a first edge of the at least one rigid PCB to establish a first joint region and a second end coupled to a second edge of a PCB connector to establish a second joint region.

In addition to one or more of the features described above, or as an alternative to any of the foregoing embodiments, the PCB connected is configured to establish signal connection with the flex circuit and a second rigid PCB.

In addition to one or more of the features described above, or as an alternative to any of the foregoing embodiments, the diagnostic trace has a serpentine profile that meanders from a first edge trace portion formed on the at least one rigid PCB and extending through the first joint region to a second edge trace portion formed on the PCB connector and extending through the second joint region.

In addition to one or more of the features described above, or as an alternative to any of the foregoing embodiments, the diagnostic device is installed on the at least one rigid PCB, a signal source is installed on the second rigid PCB, and the diagnostic trace establishes signal communication between the diagnostic device and the signal source.

In addition to one or more of the features described above, or as an alternative to any of the foregoing embodiments, the first edge trace includes a first proximate end that is connected to the diagnostic trace formed on the flex circuit and a first distal end that is connected to the diagnostic device. The second edge trace includes a second proximate end that is connected to a connection terminal installed on the PCB connector and a second distal end that is connected to the diagnostic trace formed on the flex circuit. The second rigid PCB includes a signal trace including a third proximate end connected to the signal source and a third distal end connected to a second connection terminal that is configured to establish signal communication with the first connection terminal.

In addition to one or more of the features described above, or as an alternative to any of the foregoing embodiments, the diagnostic device is a light emitting diode (LED) configured to emit light in response to a closed circuit between the signal source and the diagnostic device and configured to stop emitting light in response to an open circuit between the signal source and the diagnostic device.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

Turning now to details generally pertaining to the technical aspects of the present teachings, rigid-flex PCBs combine one or more rigid PCBs with one or more flex circuits. The ability for the rigid-flex PCB to flex allows the rigid-flex PCT to be installed within compartments or housings in a folded manner. When the flex circuit bends, some parts of the flex circuit will be more stressed than others. For instance, portions of the traces located macro bending regions will experience more physical stress than the portions of the traces located at micro bend regions. Overtime, the increased stress applied by a macro bend can cause damage or breakage to the signal traces and/or tear portions of the flex circuit.

In addition, a rigid PCB of the rigid-flex PCB is formed directly to one end of the flex circuit to define a joint region. This joint region, however, realizes increased stressed, causing the flex circuit to break or tear away from the board and sever the signal traces of the flex circuit from the signal traces on the rigid PCB. Conventional rigid-flex PCBs provide no way of indicating a disconnection or severing of the signal communication (e.g., an open circuit) between a rigid PCB and the flex circuit.

Various non-limiting embodiments of the present disclosure provide a rigid-flex PCB that includes a built-in diagnostic. The rigid-flex PCB includes one or more rigid PCBs couple to a flex circuit. The built-in diagnostic includes a serpentine diagnostic trace having one end that is connected to a signal source and an opposing end that is connected to a diagnostic device. The serpentine diagnostic trace meanders between the signal traces formed on the flex circuit and establishes an electrically conductive path between the signal source and the diagnostic device. The diagnostic device is configured to continuously test the health of the rigid-flex PCB. For example, the diagnostic device can detect a circuit fault in response to an open circuit occurring in to the serpentine diagnostic trace and generate an alert indicating the presence of a circuit fault. In this manner, the rigid-flex PCB provides a built-in diagnostic capable of indicating the occurrence of a fault or damage sustained by the flex circuit.

Figure 1:
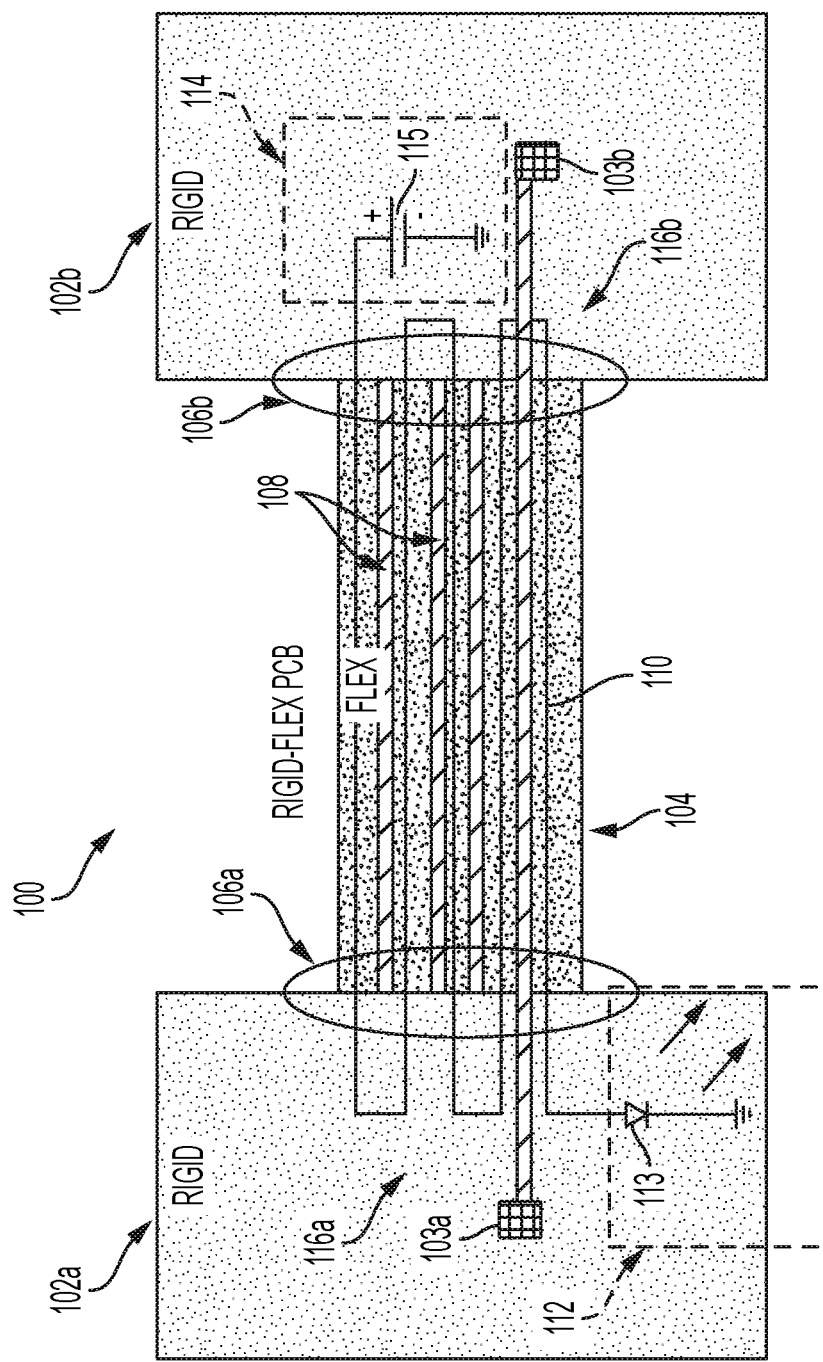
FIG. 1 depicts a rigid-flex PCB including a built-in diagnostic circuit according to a non-limiting embodiment.

With reference now to FIG. 1, a rigid-flex PCB 100 is illustrated according to a non-limiting embodiment. The rigid-flex PCB 100 includes a first rigid PCB 102a, a second rigid PCB 102b, and a flex circuit 104. Each of the first and second rigid PCBs 102a and 102b can includes a one or more electrical components 103a and 103b such as, for example, a transistor, a capacitor, a resistor, a logic gate, or a processor). The first rigid PCB 102a includes a first edge coupled to a first end of the flex circuit 104 so as to establish a first joint region 106a. Similarly, the second rigid PCB 102b includes a second edge coupled to a second end of the flex circuit opposite the first end so as to establish a second joint region 106b. The first and second rigid PCBs 102a and 102b are each formed from a rigid material such as, for example, a flat laminated composite board of non-conducting substrate material (e.g., fiberglass). The first and/or second rigid PCBs 102a and 102b can also include one or more layers of metal, as understood by one of ordinary skill in the art.

The flex circuit 104 incudes one or more signal traces 108 and a diagnostic trace 110. The signal traces 108 are configured to electrical signals to the first and/or second electrical components 103a and 103b installed on the first and second rigid PCBs 102a and 102b, respectively. The signal traces 108 are formed on the flex circuit 104 and comprise a flexible electrically conductive material, which allows the signal traces 108 to flex along with the flex circuit 104. The diagnostic trace 110 is also formed on the flex circuit 104 and also comprises a flexible electrically conductive material, which allows the diagnostic trace 110 to flex along with the flex circuit 104. In one or more non-limiting embodiments, the signal traces 108 have a first size (e.g., width) and the diagnostic trace 110 has a second size (e.g., width) that is less than the first width. In one or more non-limiting embodiments, the width of the diagnostic trace 110 is half the width or about half the width of the thinnest signal trace 108. In this manner, the diagnostic trace 110 can be formed with a greater sensitive to breakage and deterioration compared to the signal traces 108.

As described herein, the rigid-flex PCB 100 implements a built-in diagnostic circuit. The built-in diagnostic circuit utilizes the diagnostic trace 110 in conjunction with a diagnostic device 112 and a signal source 114. According to the non-limiting embodiment shown in FIG. 1, the diagnostic device 112 is installed on the first rigid PCB 102a, while the signal source 114 such as a battery 115, for example, is installed on the second rigid PCB.

In one or more non-limiting embodiments, the diagnostic trace 110 has a serpentine profile that meanders from a first edge trace portion 116a formed on the first rigid PCB 102a and extending through the first joint region 106a to a second edge trace portion 116b formed on the second rigid PCB 102b and extending through the second joint region 112b. The first edge trace portion 116a includes a first proximate end that is connected to the diagnostic trace 110 formed on the flex circuit 104 and a first distal end that is connected to the diagnostic device 112. The second edge trace portion 116b includes a second proximate end that is connected to the signal source 114 and a second distal end that is connected to the diagnostic trace 110 formed on the flex circuit 104. The first and second edge trace portions 116a and 116b increase the strength and durability of the serpentine diagnostic trace 110 because they extend onto the edges of the first and second rigid PCBs 102a and 102b, which provide additional support from bending that occurs at the first and second joint regions 106a and 106b.

The diagnostic trace 110 establishes signal communication between the diagnostic device 112 and the signal source 114. The diagnostic device 112 can include, for example, a light emitting diode (LED) 113 configured to continuously monitor the health of the rigid-flex PCB 100 based on the condition of the diagnostic trace 110. For example, the LED 112 can emit light in response to a closed circuit between the signal source and the diagnostic device. When, however, the diagnostic trace is severed or an open circuit occurs on the diagnostic trace 110 (and thus between the signal source 114 and the LED 112), the LED 113 stops emitting light thereby indicating the presence of a fault in the rigid-flex PCB 100. Accordingly, the combination of the LED 113, serpentine diagnostic trace 110, and signal supply 114 provides a built-in diagnostic circuit that continuously monitors and tests the heath of the rigid-flex PCB 100.

Figure 2:
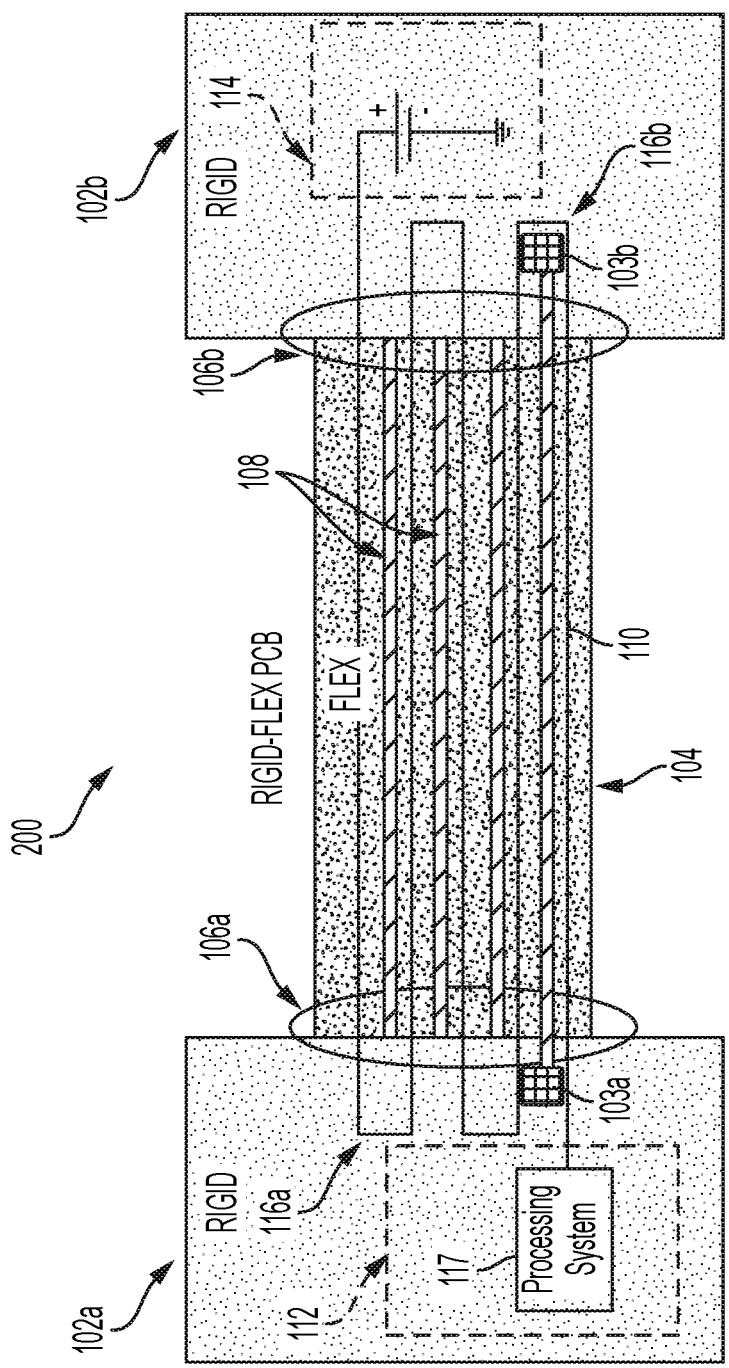
FIG. 2 depicts a rigid-flex PCB including a built-in diagnostic circuit according to another non-limiting embodiment.

Turning now to FIG. 2, a rigid-flex PCB 100 is illustrated according to another non-limiting embodiment. Like-number components operate similar to those components described with respect to FIG. 1. Therefore, details of similar components will not be repeated for the sake of brevity.

The rigid-flex PCB 200 illustrated in FIG. 2 employs a built-in diagnostic circuit that includes a diagnostic device 112 in signal communication with a signal source 114 via a diagnostic trace 110. However, the diagnostic device 112 employed in this embodiment is a processor 117 or field programmable gate array (FPGA) installed on the first rigid PCB 102a. The processor 117 is configured to execute a trace conductivity test in response to powering on the processor. Based on the trace conductivity test, the processor can generate an alert in response to detecting a severed diagnostic trace or open circuit in the diagnostic trace 110 (and thus between the signal source 114 and the LED 112). The alert can include, but is not limited to, a sound alert, a visual alert, a haptic alert and/or system alert, e.g., an interrupt to system/software that initiates a safe shutdown or a failsafe procedure.

Figure 3:
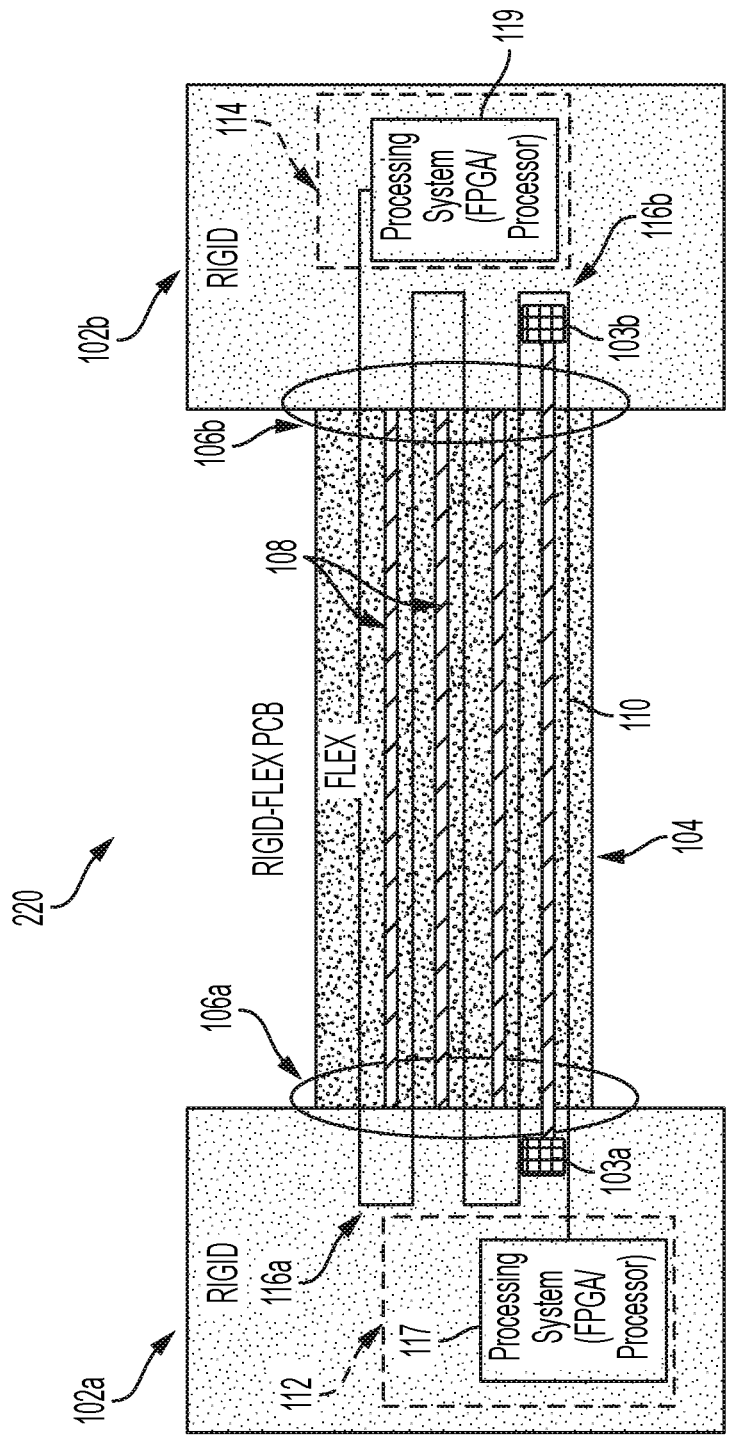
FIG. 3 depicts a rigid-flex PCB including a built-in diagnostic circuit according to another non-limiting embodiment.

The rigid-flex PCB 200 is not limited to the arrangements described above. As shown in FIG. 3, for example, a rigid-flex PCB 220 is illustrated according to yet another non-limiting embodiment. It should be appreciated that like number components operate similar to those components described with respect to FIGS. 1 and 2. Therefore, details of similar components will not be repeated for the sake of brevity. In this example, the signal source 114 is provided by a second processor or FPGA 119 located on the second rigid PCB 102b. The second FPGA 119 can generate an expected test signal, which can be confirmed by the first processor 117. For example, the test signal output from processor/FPGA 119 can be a waveform (e.g., a clock signal or pulse signal) or can be logic signal (e.g., a logic 1 value or logic value). The test signal can then be received processor/FPGA 117 located on the separate rigid PCB 102a. Accordingly, when the first processor/FPGA 117 detects the test signal and/or confirms that the received test signal matches an expected signal (e.g., stored in memory), the first processor/FPGA 117 confirms that the flex circuit 104 is correctly connected and/or is healthy (i.e., undamaged). When, however, the test signal output by the second processor/FPGA 119 is not received by the first processor/FPGA 117 and/or does not match the expected signal, the first processor/FPGA 117 confirms that there is a connection problem with the flex circuit 104 and/or the flex circuit 104 is damaged. For example, when the tests signal is not received by the first processor/FPGA 117, the first processor/FPGA can determine a severed diagnostic trace or open circuit in the diagnostic trace 110. In some embodiments, the first processor/FPGA 117 can be replaced with an LED 113 and/or speaker. In these example embodiments, the second processor/FPGA 119 outputs the test signal waveform and the LED 113 or speaker can generate a light or sound the flex circuit 104 is correctly connected and/or is healthy (i.e., undamaged) confirming the healthy or undamaged flex circuit 104.

Figure 4:
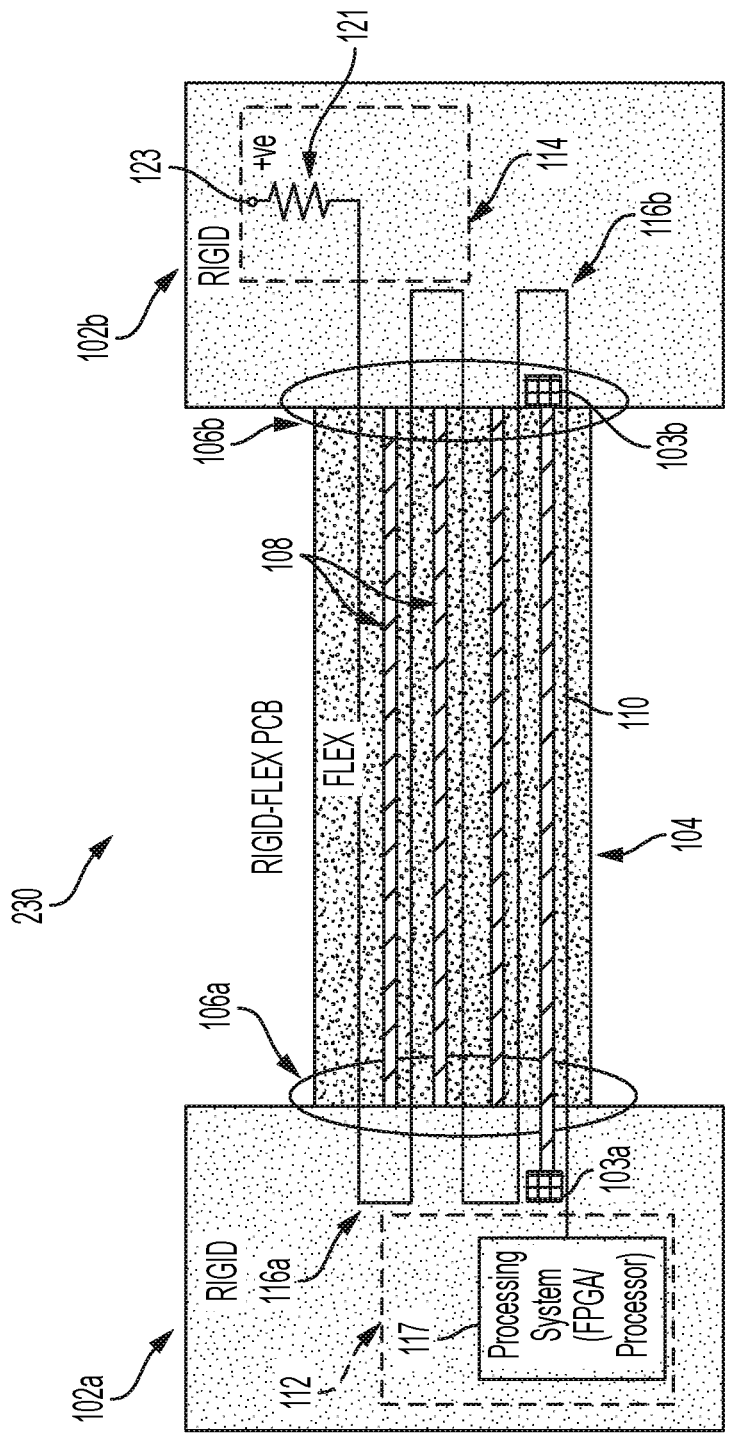
FIG. 4 depicts a rigid-flex PCB including a built-in diagnostic circuit according to another non-limiting embodiment

Turning to FIG. 4, a rigid-flex PCB 230 is illustrated according to yet another non-limiting embodiment. Like-number components operate similar to those components described with respect to FIGS. 1-3. Therefore, details of similar components will not be repeated for the sake of brevity. In this example, the signal source 114 is implemented as a discrete output signal source 114 located on the second rigid PCB 102b. The discrete output signal source can be a voltage source (Vsource) and open configuration established using a weak pull up resistor to a positive voltage (+V) supply rail. Accordingly, the processor/FPGA 117 can determine the connection and health of the flex circuit 104 based on whether it detects the signal output by the output signal source 114, i.e., voltage of the supply rail 123.

Figure 5:
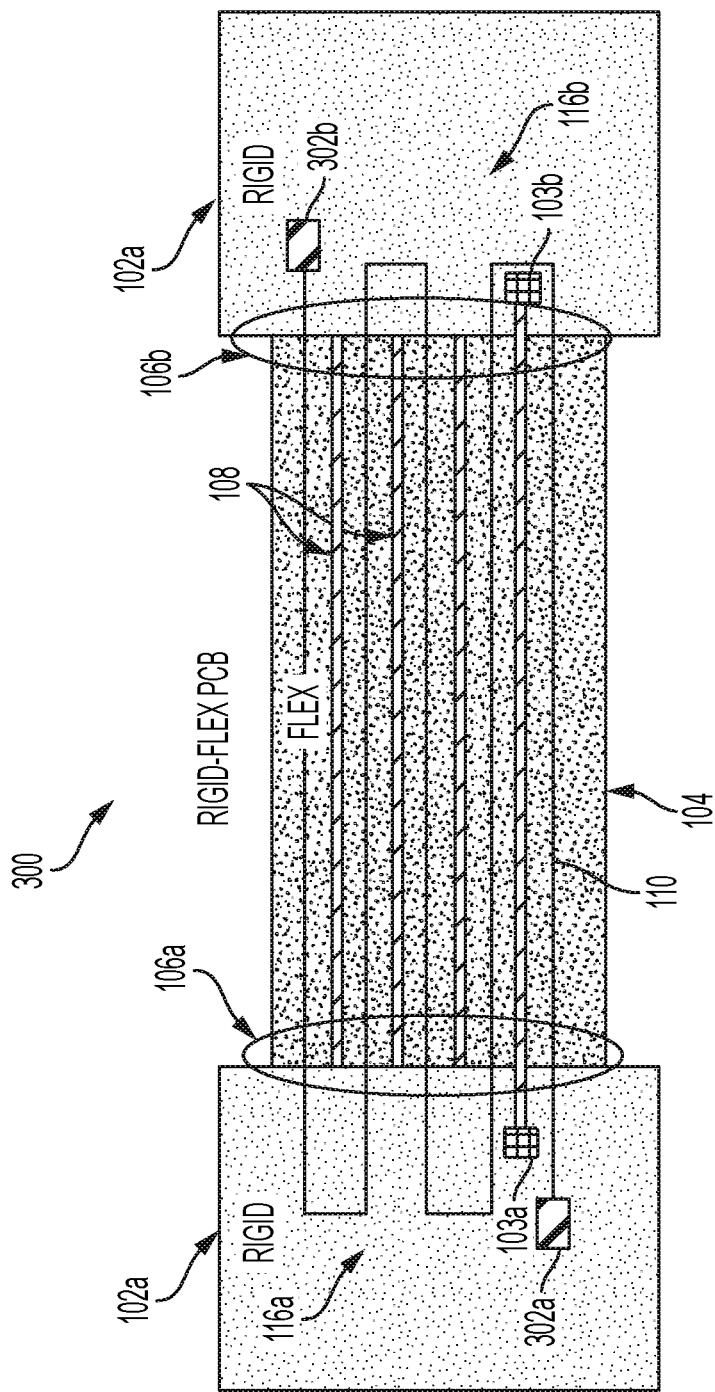
FIG. 5 depicts a rigid-flex PCB including a built-in diagnostic circuit according to another non-limiting embodiment.

Referring now to FIG. 5, a rigid-flex PCB 300 is illustrated according to yet another non-limiting embodiment. Like-number components operate similar to those components described with respect to FIGS. 1-4. Therefore, details of similar components will not be repeated for the sake of brevity. The rigid-flex PCB 300 illustrated in FIG. 5 can employ a continuous built-in test (CBIT) diagnostic circuit. The CBIT diagnostic circuit includes a first test pad 302a formed on the first rigid PCB 102a, a second test pad 302b formed on the second rigid PCB 102b, and a serpentine diagnostic trace 110 that establishes signal communication between the first test pad 302a and the second test pad 302b. More specifically, the first edge trace 116a of the serpentine diagnostic trace 110 includes a first proximate end that is connected to the diagnostic trace 110 formed on the flex circuit 104 and a first distal end that is connected to the first test pad 302a. The second edge trace 116b of the serpentine diagnostic trace 110 includes a second edge trace 116b that includes a second proximate end that is connected to the second test pad 302b and a second distal end that is connected to the diagnostic trace 110 formed on the flex circuit 104.

The first test pad 302a is configured to be connected to a first input of a diagnostic device and the second test pad 302b is configured to be connected to a second input of the diagnostic device. Based on the input connections, the diagnostic device such as an ohm meter or volt meter, for example, can measure one or more of a resistance between the first test pad 302a and the second test pad 302b, current between the first test pad 302a and the second test pad 302b, and/or voltage between the first test pad 302a and the second test pad 302b. When performing a real-time CBIT, for example, a processor can be connected to the first test pad 302a and a diagnostic tool can be connected to the second test pad 302b. Accordingly, the processor can initiate a safe shutdown/fail safe in response to an open circuit between the diagnostic tool and processor.

Figure 6A:
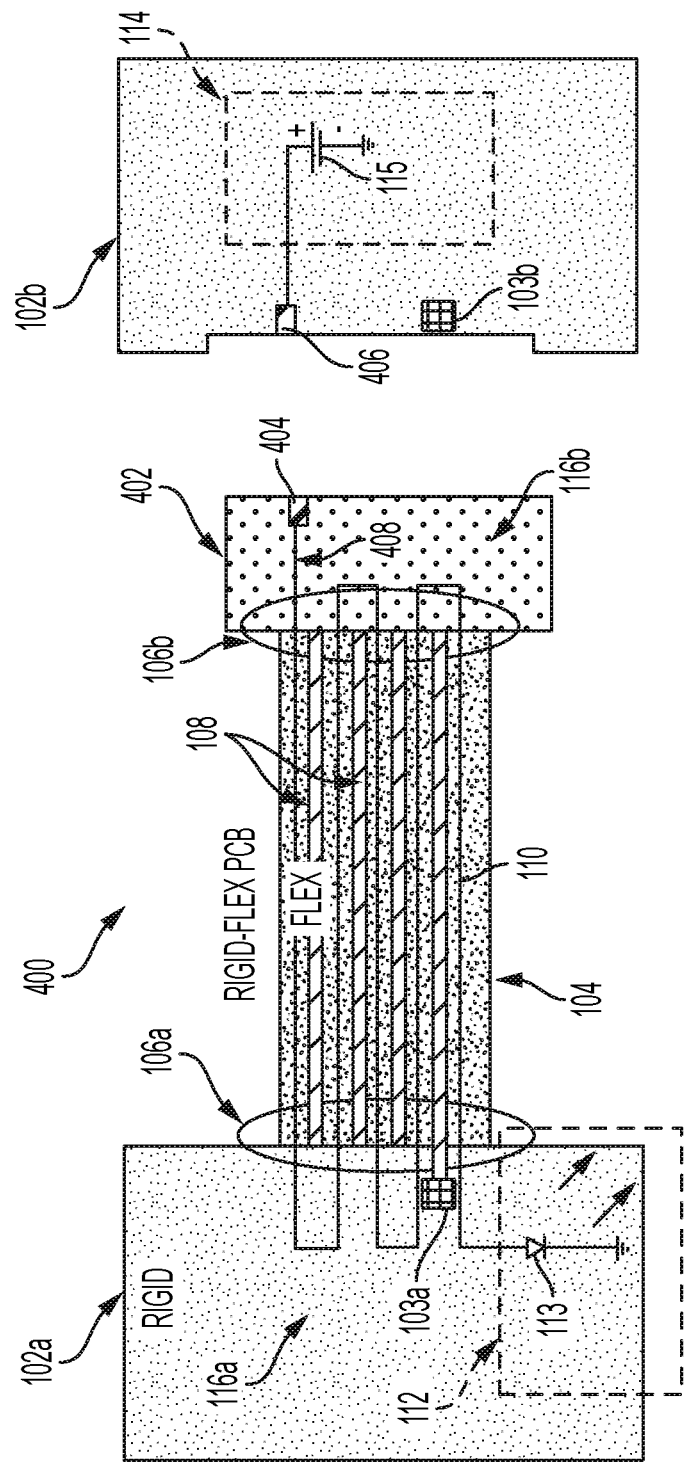
FIGS. 6A and 6B depict a rigid-flex PCB including a built-in diagnostic circuit according to a non-limiting.
Figure 6B:
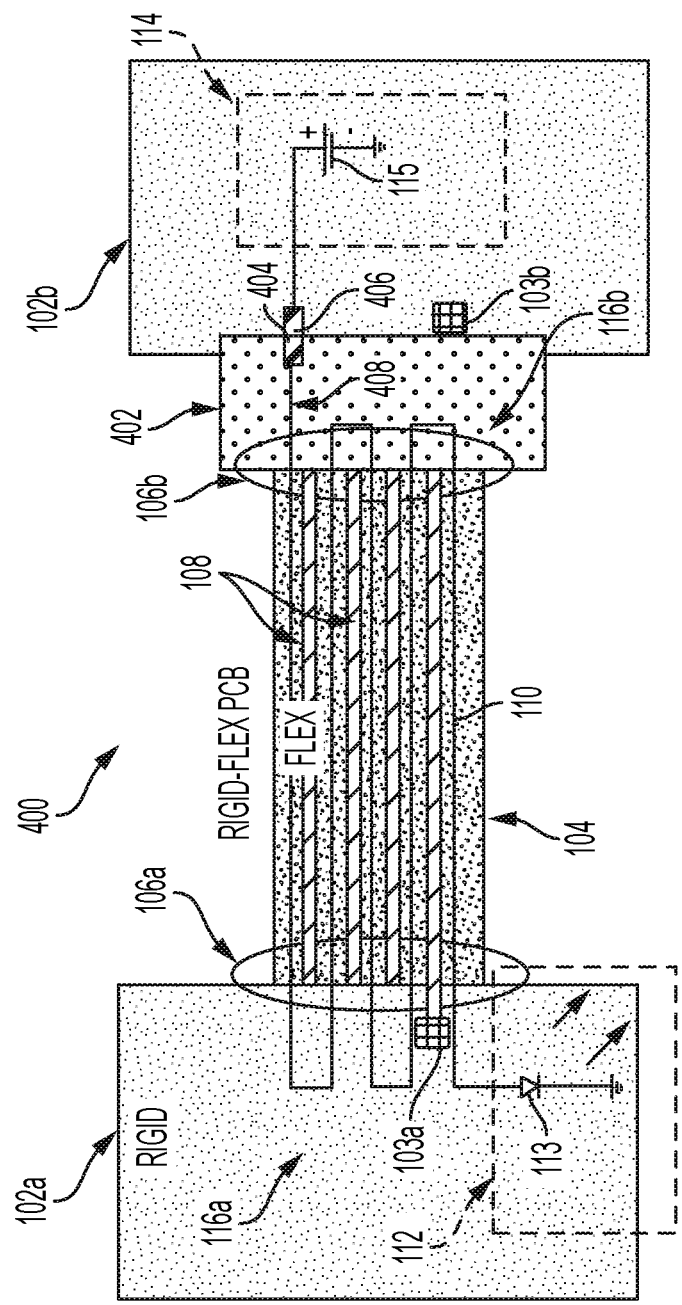

Turning to FIGS. 6A and 6B, a rigid-flex PCB 400 is illustrated according to still another non-limiting embodiment. Like-number components operate similar to those components described with respect to FIGS. 1, 2 and 3. Therefore, details of similar components will not be repeated for the sake of brevity.

In this example, the flex circuit 104 includes a first end coupled to an edge of a first rigid PCB 102a to establish a first joint region 106a and a second end coupled to an edge of a PCB connector 402 to establish a second joint region 106b. The PCB connector 402 is configured to establish signal connection between the flex circuit 104 and a second rigid PCB 102b.

As shown in FIG. 6A, the PCB connector 402 can include a first connection terminal 404 and the second rigid PCB 102b can include a second connection terminal 406 configured to mate with the first connection terminal 404. The first edge trace 116a includes a first proximate end that is connected to the diagnostic trace 110 formed on the flex circuit 104 and a first distal end that is connected to a diagnostic device 112. The second edge trace 116b includes a second proximate end that is connected to the first connection terminal 406 and a second distal end that is connected to the diagnostic trace 110 formed on the flex circuit 104.

The second rigid PCB 102b includes a signal trace 408 including a third proximate end connected to a signal source 114 and a third distal end connected to the second connection terminal 408. As shown in FIG. 6B, the PCB connector 402 can be connected to the second rigid PCB 102b such that first and second connection terminal 406 and 408 are connected to one another. Accordingly, signal communication can be established between the signal source 114 installed on the second rigid PCB 102b and the diagnostic device 112 installed on the first rigid PCB 102a.

As described herein, various non-limiting embodiments provide a rigid-flex PCB that includes a built-in diagnostic. The rigid-flex PCB includes one or more rigid PCBs couple to a flex circuit. The built-in diagnostic includes a serpentine diagnostic trace having one end that is connected to a signal source and an opposing end that is connected to a diagnostic device. The serpentine diagnostic trace meanders between the signal traces formed on the flex circuit and establishes an electrically conductive path between the signal source and the diagnostic device. In one or more non-limiting embodiments, one or more signal traces 108 are located between a first portion of the diagnostic trace 110 formed on the flex circuit 104 and a second portion of the diagnostic trace 110 formed on the flex circuit 104. The diagnostic device is configured to detect an open circuit in response to an open circuit occurring in to the serpentine diagnostic trace, and to generate an alert indicating the open circuit. In this manner, the rigid-flex PCB provides a built-in diagnostic capable of indicating the occurrence of a fault or damage sustained by the flex circuit.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A rigid-flex printed circuit board (PCB) comprising:
at least one rigid PCB including at least one electrical component;
a flex circuit including at least one end connected to the at least one rigid PCB, the flex circuit including at least one signal trace configured to deliver an electrical signal to the at least one electrical component;
a built-in diagnostic circuit configured to detect a fault in the rigid-flex PCB, the built-in diagnostic circuit comprising:
a diagnostic device installed on the at least one rigid PCB; and
a diagnostic trace formed on the flex circuit,
wherein the diagnostic device detects the circuit fault in response to an open circuit occurring in the diagnostic trace,
wherein the diagnostic device generates an alert in response to detecting the fault, the fault including one or more of a light alert, a sound alert, a haptic alert, and an interrupt to system software to initiate a safe shutdown or a fail-safe procedure, and
wherein the diagnostic trace has a serpentine profile that meanders from a first edge trace portion formed on the first rigid PCB and extending through the first joint region to a second edge trace portion formed on the second rigid PCB and extending through the second joint region.

2. The rigid-flex PCB of claim 1, wherein the at least one rigid PCB comprises:
a first rigid PCB including a first electrical component the first electrical component including at least one of a transistor, a capacitor, a resistor, a logic gate, and a processor, and the first rigid PCB including a first edge coupled to a first end of the flex circuit to establish a first joint region,
a second rigid PCB including a second electrical component, the second rigid PCB including a second edge coupled to a second end of the flex circuit opposite the first end to establish a second joint region,
wherein the first and second rigid PCBs are formed from a rigid material.

3. The rigid-flex PCB of claim 1, wherein the diagnostic device is installed on the first rigid PCB, a signal source is installed on the second rigid PCB, and the diagnostic trace establishes signal communication between the diagnostic device and the signal source.

4. The rigid-flex PCB of claim 3, wherein the first edge trace includes a first proximate end that is connected to the diagnostic trace formed on the flex circuit and a first distal end that is connected to the diagnostic device, and wherein the second edge trace includes a second proximate end that is connected to the signal source and a second distal end that is connected to the diagnostic trace formed on the flex circuit.

5. The rigid-flex PCB of claim 4, wherein the diagnostic device is a light emitting diode (LED) configured to emit light in response to a closed circuit between the signal source and the diagnostic device, and configured to stop emitting light in response to an open circuit between the signal source and the diagnostic device.

6. The rigid-flex PCB of claim 4, wherein the diagnostic device is a processor configured to execute at least one of a trace conductivity test and a Power on Built in Test (PBIT) in response to powering on the processor, the processor configured to generate the alert in response to an open circuit between the signal source and the diagnostic device.

7. The rigid-flex PCB of claim 4, wherein the at least one signal trace has a first size and the diagnostic trace has a second size that is less than the first width.

8. The rigid-flex PCB of claim 4, wherein the at least one signal trace is located between a first portion of the diagnostic trace formed on the flex circuit and a second portion of the diagnostic trace formed on the flex circuit.

9. The rigid-flex PCB of claim 1, wherein the built-in diagnostic circuit comprises:
a first edge trace that includes a first proximate end that is connected to the diagnostic trace formed on the flex circuit and a first distal end that is connected to a first test pad; and
a second edge trace that includes a second proximate end that is connected to a second test pad and a second distal end that is connected to the diagnostic trace formed on the flex circuit.

10. The rigid-flex PCB of claim 9, wherein the first test pad is configured to be connected to a first input of a diagnostic device and the second test pad is configured to be connected to a second input of the diagnostic device.

11. The rigid-flex PCB of claim 10, wherein the diagnostic device measures one or more of resistance between the first test pad and the second test pad, current between the first test pad and the second test pad, and voltage between the first test pad and the second test pad.

12. The rigid-flex PCB of claim 1, wherein the flex circuit includes a first end coupled to a first edge of the at least one rigid PCB to establish a first joint region and a second end coupled to a second edge of a PCB connector to establish a second joint region.

13. The rigid-flex PCB of claim 12, wherein the PCB connected is configured to establish signal connection with the flex circuit and a second rigid PCB.

14. The rigid-flex PCB of claim 13, wherein the diagnostic trace has a serpentine profile that meanders from a first edge trace portion formed on the at least one rigid PCB and extending through the first joint region to a second edge trace portion formed on the PCB connector and extending through the second joint region.

15. The rigid-flex PCB of claim 14, wherein the diagnostic device is installed on the at least one rigid PCB, a signal source is installed on the second rigid PCB, and the diagnostic trace establishes signal communication between the diagnostic device and the signal source.

16. The rigid-flex PCB of claim 15, wherein the first edge trace includes a first proximate end that is connected to the diagnostic trace formed on the flex circuit and a first distal end that is connected to the diagnostic device, wherein the second edge trace includes a second proximate end that is connected to a connection terminal installed on the PCB connector and a second distal end that is connected to the diagnostic trace formed on the flex circuit, and wherein the second rigid PCB includes a signal trace including a third proximate end connected to the signal source and a third distal end connected to a second connection terminal that is configured to establish signal communication with the first connection terminal.

17. The rigid-flex PCB of claim 16, wherein the diagnostic device is a light emitting diode (LED) configured to emit light in response to a closed circuit between the signal source and the diagnostic device and configured to stop emitting light in response to an open circuit between the signal source and the diagnostic device.

18. A rigid-flex printed circuit board (PCB) comprising:
at least one rigid PCB including at least one electrical component;
a flex circuit including at least one end connected to the at least one rigid PCB, the flex circuit including at least one signal trace configured to deliver an electrical signal to the at least one electrical component;
a built-in diagnostic circuit configured to detect a fault in the rigid-flex PCB, the built-in diagnostic circuit comprising:
a diagnostic device installed on the at least one rigid PCB; and
a diagnostic trace formed on the flex circuit,
wherein the diagnostic device detects the circuit fault in response to an open circuit occurring in the diagnostic trace,
wherein the diagnostic device generates an alert in response to detecting the fault, the fault including one or more of a light alert, a sound alert, a haptic alert, and an interrupt to system software to initiate a safe shutdown or a fail-safe procedure,
wherein the built-in diagnostic circuit comprises:
a first edge trace that includes a first proximate end that is connected to the diagnostic trace formed on the flex circuit and a first distal end that is connected to a first test pad; and
a second edge trace that includes a second proximate end that is connected to a second test pad and a second distal end that is connected to the diagnostic trace formed on the flex circuit, and
wherein the first test pad is configured to be connected to a first input of a diagnostic device and the second test pad is configured to be connected to a second input of the diagnostic device.

\* \* \* \* \*